(12) United States Patent
Moon et al.

(10) Patent No.: US 8,361,679 B2
(45) Date of Patent: Jan. 29, 2013

(54) PHASE SHIFT MASKS

(75) Inventors: Se-Gun Moon, Suwon-si (KR); Dong-Seok Nam, Yongin-si (KR); Hoon Kim, Siheung-si (KR)

(73) Assignee: Samsung Electronics Co. Ltd., Suwon-si (KR)

( * ) Notice: Subject to any disclaimer, the term of this patent is extended or adjusted under 35 U.S.C. 154(b) by 147 days.

(21) Appl. No.: 12/900,691

(22) Filed: Oct. 8, 2010

(65) Prior Publication Data

US 2011/0086296 A1 Apr. 14, 2011

(30) Foreign Application Priority Data

Oct. 9, 2009 (KR) ........................ 10-2009-0096277

(51) Int. Cl.
*G03F 1/26* (2012.01)
(52) U.S. Cl. .............................................. 430/5; 430/22
(58) Field of Classification Search .............. 430/5, 322, 430/323, 394
See application file for complete search history.

(56) References Cited

U.S. PATENT DOCUMENTS

| 7,582,396 B2 * | 9/2009 | Lin ................................... 430/5 |
| 2003/0064297 A1 * | 4/2003 | Shiota et al. ..................... 430/5 |

FOREIGN PATENT DOCUMENTS

| JP | 2009-086094 | 4/2009 |
| KR | 20080062751 | 7/2008 |
| KR | 20090050493 | 5/2009 |

* cited by examiner

*Primary Examiner* — Stephen Rosasco
(74) *Attorney, Agent, or Firm* — Stanzione & Kim, LLP

(57) ABSTRACT

A phase shift mask having a first region and a second region in a transverse direction includes a transparent layer, a phase shift pattern disposed in the first region, a transmittance control layer pattern disposed in the second region, and a shading layer pattern disposed on the transmittance control layer pattern. The phase shift pattern has a first pattern including a transparent material and a second pattern including metal. The phase shift mask may prevent haze effects through a cleaning process using an alkaline cleaning solution.

19 Claims, 5 Drawing Sheets

PHASE SHIFT MASKS

CROSS-REFERENCE TO RELATED APPLICATIONS

This application claims the benefit of priority under 35 U.S.C. §119 to Korean patent Application No. 2009-96277, filed on Oct. 9, 2009, the disclosure of which is incorporated by reference herein in its entirety.

BACKGROUND

1. Field of the Invention

Example embodiments of the general inventive concept relate to phase shift masks and method of forming phase shift masks. More particularly, example embodiments of the present general inventive concept relate to phase shift masks to prevent a haze defect as a result of a cleaning with alkaline chemicals, and method of forming the phase shift masks.

2. Description of the Related Art

As semiconductor devices have been developed to improve integration, reliability, and response speed, the dimensions of various elements in an integrated circuit device have been reduced. Recently, the elements in semiconductor devices have been manufactured with very minute critical dimension (CD) below about 0.07 μm. The reduction of the dimensions of the semiconductor devices may require that various minute patterns included in the semiconductor device have a higher resolution.

To obtain a minute pattern having high resolution, various resolution enhancement technologies (RET) have been employed in semiconductor manufacturing processes. For example, to ensure irradiating of a light onto a minute region of an object, the number of the numerical aperture may be increased, a dipole illumination procedure or a cross-pole illumination procedure may be employed, or a light having a short wavelength may be used as a light source in an exposure process. The light for forming a minute pattern may include a krypton fluoride (KrF) eximer laser having a wavelength of about 248 nm, an argon fluoride (ArF) eximer laser having a wavelength of about 193 nm, or a fluorine ($F_2$) eximer laser having a wavelength of about 157 nm, for example.

When a minute pattern is formed using the light having the short wavelength, a depth of focusing (DOF) of the exposure process may be deteriorated although the minute pattern may have improved resolution. Thus, a phase shift mask (PSM) has been developed to form a minute pattern having desired resolution instead of the use of the light having the short wavelength.

A conventional phase shift mask usually includes a phase shift layer formed by forming recesses in a predetermined portion of a transparent substrate having a metal layer coated thereon. The phase shift layer may transmit light through different light passages thereof, and thus the light transmitted through one passage may have a phase difference of about 180° from light passing through adjacent openings of the phase shift mask. The light having the phase difference of about 180° may cause destructive interference, so that the intensity of the lights may be diminished or reduced substantially to zero.

Generally, a cleaning process is performed on the phase shift mask to completely remove contaminants remaining on a surface of the phase shift mask before forming a minute pattern having high resolution using the phase shift mask. As for a cleaning process to clean the conventional phase shift mask including a single chrome (Cr) layer or having a structure including a chrome layer and a molybdenum silicon (MoSix) layer, the contaminants (e.g., a photoresist pattern used for forming the phase shift mask, polymers generated in an etching process, etc.) may be completely removed from the phase shift mask. The conventional phase shift mask is generally cleaned using a cleaning solution including sulfuric acid ($H_2SO_4$). After cleaning the phase shift mask, a rinsing process is executed on the cleaned phase shift mask using deionized (DI) water having high temperature. However, the rinsing process may not completely remove the cleaning solution including sulfuric acid from the phase shift mask because the cleaning solution has relatively high viscosity. Therefore, haze defects may be generated on the phase shift mask due to the cleaning solution remaining on the phase shift mask.

Meanwhile, the phase shift layer of the phase shift mask may be damaged by hydroxyl group (—OH) in ammonium hydroxide ($NH_4OH$) when the phase shift mask is cleaned using a standard cleaning 1 (SC1) solution. The damaged phase shift layer may cause defects of the phase shift mask. As a result, a minute pattern having desired high resolution may not be obtained using such phase shift mask because of phase shift of light and transmittance variation of light.

Considering the above-described problems, the phase shift mask is rinsed using a solution including diluted ammonium hydroxide reacting with sulfuric acid. However, the sulfuric acid may not be fully removed from the phase shift mask because relatively weak ammonium hydroxide may not effectively neutralize sulfuric acid causing the haze defects of the phase shift mask. Therefore, the phase shift mask may not produce the minute pattern having the desired high resolution because of the remaining contaminants that cause the haze defects of the phase shift mask.

SUMMARY

Example embodiments provide phase shift masks to prevent haze defects by completely removing remaining sulfuric acid through a cleaning solution including alkaline chemicals.

Example embodiments also provide methods of forming phase shift masks to prevent haze defects by completely removing remaining sulfuric acid through a cleaning solution including alkaline chemicals.

Features and/or utilities of the present general inventive concept may include a phase shift mask including a transparent layer having a first region and a second region, a phase shift pattern disposed in the first region, a transmittance control layer pattern disposed in the second region, and a shading layer pattern disposed on the transmittance control layer pattern. The phase shift pattern may include a first pattern including a transparent material and a second pattern including metal.

The first pattern may be integrally formed with the transparent layer.

The first pattern may include quartz, glass, or transparent resin.

The second pattern may include chrome, chrome oxide, and/or chrome oxynitride.

The second pattern may include a material substantially the same as or substantially similar to a material of the transmittance control layer pattern.

The first pattern may have a thickness substantially the same as or substantially similar to a thickness of the second pattern.

The shading layer pattern may include molybdenum silicon, molybdenum silicon oxide, and/or molybdenum silicon oxynitride.

The shading layer pattern may have a dimension substantially smaller than a dimension of the transmittance control layer pattern.

The shading layer pattern may have an etching selectivity substantially the same as or substantially similar to an etching selectivity of the transparent layer.

Features and/or utilities of a phase shift mask including a transparent layer, a transmittance control layer disposed on the transparent layer, a shading layer disposed on the transmittance control layer, and a hard mask layer disposed on the shading layer. The transmittance control layer including chrome. The hard mask layer including chrome.

The transmittance control layer may have a transmittance in a range of about 3% to about 10% of a transmittance of the transparent layer.

The transmittance layer may include a material substantially the same as or substantially similar to a material of the hard mask layer.

The hard mask layer may include chrome, chrome oxide, and/or chrome oxynitride.

Features and/or utilities of the present general inventive concept may include a method of forming a phase shift mask having a first region and a second region in a transverse direction, the method including forming a transmittance control layer on a transparent layer, forming a shading layer on the transmittance control layer, and forming a hard mask layer on the shading layer, the hard mask layer etched to form a first hard mask in the first region and to form a second hard mask in the second region. A first shading layer pattern is formed in the first region and a preliminary second shading layer pattern is formed in the second region by etching the shading layer using the first and the second hard mask patterns as etching masks. The transmittance layer is etched using the first and the second hard mask patterns and the first and the preliminary second shading layer patterns as etching masks, so that a transmittance layer pattern is formed beneath the shading layer pattern, and a first pattern of a phase shift pattern is formed in the first region. A second pattern of the phase shift pattern is formed beneath the first pattern by etching a portion of the transparent layer.

In forming the first and the second hard mask patterns according to example embodiments, a first photoresist pattern may be formed on the hard mask layer in the first region, and a second photoresist pattern may be formed on the hard mask layer in the second region. The first and the second hard mask patterns may be formed by etching the hard mask layer using the first and the second photoresist patterns as etching masks. Then, the first and the second photoresist patterns may be removed. Here, the first and the second photoresist patterns may be removed by an ashing process using plasma and/or a stripping process.

The first and the second hard mask patterns may be removed while forming the transmittance layer pattern and the upper pattern of the phase shift pattern.

A third photoresist pattern may be formed on the preliminary second shading layer pattern after forming the upper pattern of the phase shift pattern. A second shading layer pattern may be formed by partially etching the preliminary shading layer pattern using the third photoresist pattern as an etching mask. Then, the third photoresist pattern may be removed.

The first shading layer pattern may be removed while forming the second shading layer pattern.

The first shading layer pattern may be removed and the second shading layer pattern may be formed while forming the lower pattern of the phase shift pattern.

According to example embodiments, impurities and sulfuric acid ions causing haze defects may be completely removed from the phase shift mask without any damage to the phase shift pattern by a cleaning process using an alkaline cleaning solution. Therefore, the phase shift mask may effectively prevent phase shift of light and transmittance variation of light which are generated by the damage to the phase shift pattern. When a minute pattern in a semiconductor device is formed using the phase shift mask, the minute pattern may have high resolution, desired dimensions, and required structure.

Features and/or utilities of the present general inventive concept may also be realized by a phase shift mask having a first region and a second region surrounding the first region, the phase shift mask including a phase shift pattern in the first region and including a first transparent pattern and a second pattern including metal located on the first pattern, a transmittance control layer in the second region, and a shading pattern located on the transmittance control layer in the second region.

The phase shift mask may further include a transparent layer, the first transparent pattern may be formed in the transparent layer, and the transmittance control layer may be located on the transparent layer.

The second pattern may cover the first pattern, and the transmittance control layer may cover an entire part of the transparent layer located in the second region.

The transmittance control layer may have a transmittance in a range of about 3% to about 10% of a transmittance of the transparent layer.

The transmittance control layer and the second pattern may be made of the same material.

An end of the shading pattern closest to the phase shift pattern may be offset from an end of the transmittance control layer adjacent to the phase shift pattern in a direction away from the phase shift pattern.

The second pattern may include chrome.

Features and/or utilities of the present general inventive concept may also include a method of forming a phase shift mask having a first region and a second region surrounding the first region, the method including forming a transmittance control layer on a transparent layer, forming a shading layer on the transmittance control layer, removing portions of the shading layer in the first region to form a shading layer border, and removing portions of the transmittance control layer and the transparent layer to form a phase shift pattern in the first region and a transmittance control layer border in the second region.

Removing portions of the transmittance control layer may include forming a hard mask pattern on the shading layer, removing portions of the shading layer exposed through the hard mask pattern, and after removing the portions of the shading layer exposed through the hard mask pattern, removing portions of the transmittance control layer exposed through the shading layer and the hard mask pattern.

Removing portions of the transparent layer may include, after removing portions of the shading layer and the transmittance control layer exposed through the hard mask pattern, removing portions of the transparent layer exposed through the transmittance control layer and the shading layer.

The method may further include removing the hard mask pattern from the shading layer before removing portions of the transparent layer.

Removing portions of the shading layer in the first region to form the shading layer border may include, after removing the hard mask pattern, forming a photoresist pattern on the shading layer in the second region, the photoresist pattern having an end closest to the first region that is offset from the first region by a predetermined distance, and removing portions of the shading layer in the first and second regions exposed through the photoresist pattern.

The portions of the transparent layer exposed through the transmittance control layer and the shading layer are removed simultaneously with the portions of the shading layer in the first and second regions exposed through the photoresist pattern.

BRIEF DESCRIPTION OF THE DRAWINGS

Example embodiments of the inventive concepts can be understood in more detail from the following description taken in conjunction with the accompanying drawings, in which.

DETAILED DESCRIPTION OF THE EMBODIMENTS

Figure 1:
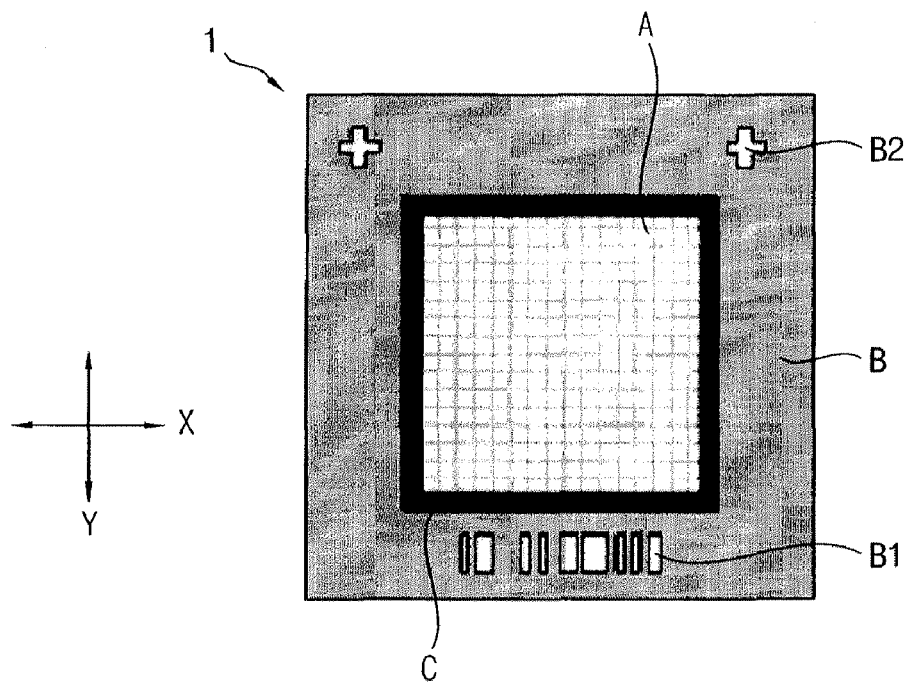
FIG. 1 is a plan view illustrating a phase shift mask in accordance with example embodiments.

Example embodiments of the inventive concept are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a phase shift mask in accordance with example embodiments.

Referring to FIG. 1, the phase shift mask 1 may include a first region A and a second region B surrounding the first region A in a transverse direction T of the phase shift mask, or a direction corresponding to a length or width of the phase shift mask 1. The second region B of the phase shift mask 1 may include a mask code B1, an alignment key B2, etc. Other portions of the phase shift mask 1 may be opaque except the first region A, the mask code B1, and the alignment key B2.

A required pattern may be disposed in the first region A of the phase shift mask 1, and a shading layer pattern C may be disposed adjacent to the first region A. The shading layer pattern C may surround the first region A.

In the present specification and claims, the term "transverse direction" refers to a direction parallel to a plane defined by a length axis and a width axis of the phase shift mask 1. In FIG. 1, the length axis and width axis are represented by the symbols Y and X, respectively. The second region B surrounds the first region A in a transverse direction T, or in any direction parallel to the plane defined by the directional axes X and Y.

Figure 2:
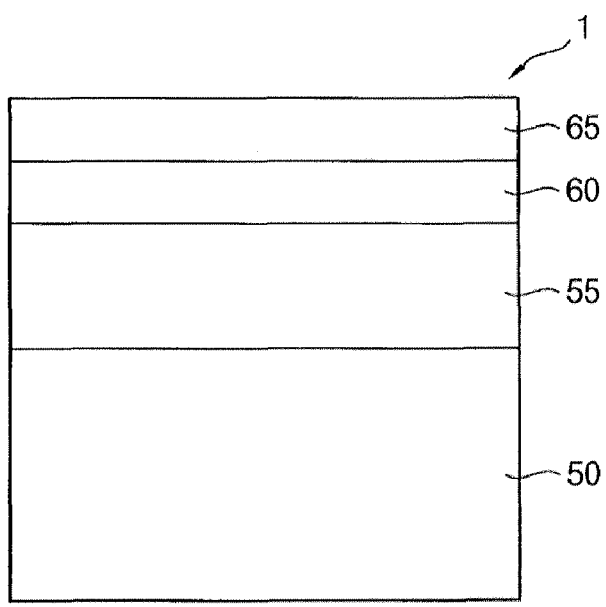
FIG. 2 is a cross sectional view illustrating a phase shift mask in accordance with example embodiments.

FIG. 2 is a cross sectional view illustrating a phase shift mask 1 in accordance with example embodiments.

Referring to FIG. 2, the phase shift mask includes a transparent layer 50, a transmittance control layer 55, a shading layer 65, and a hard mask layer 65.

The transparent layer 50 may include a transparent material to transmit an incident light therethrough. For example, the transparent layer 50 may include quartz, glass, transparent resin, etc.

The transmittance control layer 55 is disposed on the transparent layer 50. The transmittance control layer 55 may include metal such as chrome (Cr) and/or a metal compound. For example, the transmittance control layer 55 may include chrome, chrome oxide (CrOx), chrome oxynitride (CrOxNy), etc. These may be used alone or in a combination thereof. In example embodiments, the transmittance control layer 55 may have a transmittance of about 3% to about 10% of a transmittance of the transparent layer 50 by adjusting a thickness of the transmittance control layer 55. For example, the transmittance control layer 55 may have a transmittance of about 6% relative to an incident light when the transparent layer 50 has a transmittance of about 100%. When the transmittance control layer 55 includes chrome, the transmittance control layer 55 may ensure high endurance with respect to an alkaline cleaning solution, so that the transmittance control layer 55 may not be damaged by the alkaline cleaning solution.

The shading layer 60 is formed on the transmittance control layer 55. The shading layer 60 may remain at a peripheral portion of the phase shift mask, and may block a light irradiated to the peripheral portion of the phase shift mask. Additionally, the shading layer 60 may reduce a stress generated between the transmittance control layer 55 and the hard mask layer 65 to improve a mechanical strength of the phase shift mask. The shading layer 60 may include molybdenum compound. For example, the shading layer 60 may include molybdenum silicon (MoSix), molybdenum silicon oxide (MoSixOy), molybdenum silicon oxynitride (MoSixOyNz), etc. These may be used alone or in a combination thereof.

The hard mask layer 65 on the shading layer 60 may serve as a mask to form a required phase shift pattern of the phase shift mask. The hard mask layer 65 may include metal and/or a metal compound. For example, the hard mask layer 65 may include, chrome, chrome oxide, chrome oxynitride, etc. These may be used alone or in a combination thereof. In example embodiments, the hard mask layer 65 may include a material substantially the same as or substantially similar to that of the transmittance control layer 55. For example, the hard mask layer 65 and the transmittance control layer 55 may include the above-mentioned chrome and/or chrome compound.

Generally, haze defects of a phase shift mask may cause undesired ions to remain on the phase shift mask after cleaning processes. Although the remaining ions may not of themselves reduce a transmittance of the phase shift mask, the remaining ions may be combined each other when the ions are exposed to ultra violet (UV) light. These combined ions may reduce the transmittance of the phase shift mask to thereby generate a failure of the minute pattern obtained using such phase shift mask. Main ions that cause the haze defect of the phase shift mask may be sulfuric acid ions. Since the sulfuric ions may have poor solubility relative to deionized water, the sulfuric acid ions may not be sufficiently removed from the phase shift mask when the phase shift mask is cleaned using deionized water. To remove such sulfuric acid ions from the phase shift mask, the phase shift mask may be additionally cleaned using an alkaline cleaning solution. When the phase shift mask is cleaned using the alkaline solution such as standard cleaning 1 (SC 1) solution, the sulfuric ions may react with alkaline ions to produce a salt may on the phase shift mask. This salt may have good solubility with respect to deionized water, so that the salt may be easily removed from the phase shift mask. However, the phase shift mask may be easily damaged in the cleaning process when the phase shift mask has low endurance relative to the alkaline cleaning solution.

In example embodiments, the transmittance layer 55 may have high endurance with respect to the strong alkaline cleaning solution like the SC 1 solution, such that a phase shift pattern formed from the transmittance layer 55 may not be damaged by the alkaline cleaning solution while cleaning the phase shift mask. Further, sulfuric acid ions mainly causing the haze defects of the phase shift mask may be effectively removed from the phase shift mask using the alkaline cleaning solution. Therefore, the phase shift mask may prevent serious problems such as transmittance variation of the phase shift mask and undesired phase variation of a light passing through the phase shift mask.

FIGS. 3 to 9 are cross sectional views illustrating a method of forming a phase shift mask having a phase shift pattern in accordance with example embodiments.

Figure 3:
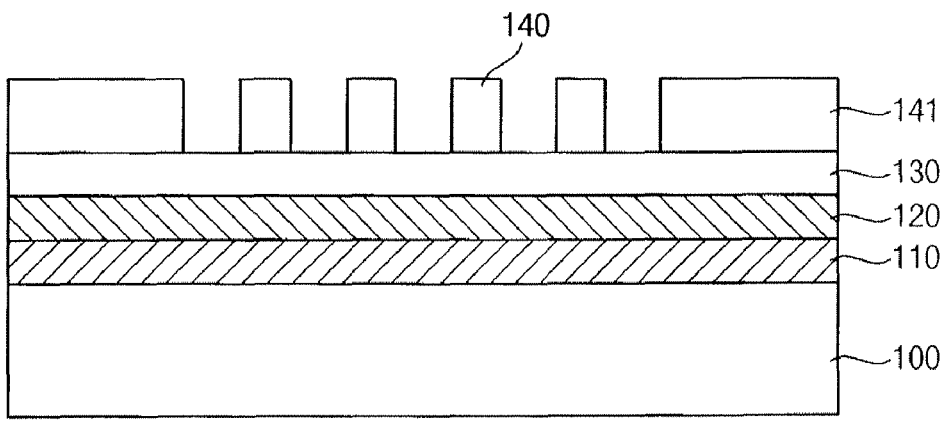
FIGS. 3 to 9 are cross sectional views illustrating a method of forming a phase shift mask having a phase shift pattern in accordance with example embodiments.

Referring to FIG. 3, a transparent layer 100 is provided. The transparent layer 100 may include a transparent material to transmit a light therethrough. For example, the transparent layer 100 may include quartz, glass, transparent resin, etc. In example embodiments, the transparent layer 100 may include a quartz substrate, a glass substrate, a transparent resin substrate, etc.

The transparent layer 100 may have a first region and a second region. A predetermined pattern for forming a minute pattern having high resolution may be formed in the first region of the transparent layer 100. The second region of the transparent layer 100 may block light from the adjacent first region in successive exposure processing of forming the phase shift mask.

A transmittance control layer 110 is formed on the transparent layer 100. The transmittance control layer 110 may control a transmittance of a light irradiated to the transmittance control layer 110 in the exposure process. In example embodiments, the transmittance control layer 110 may have a transmittance in a range of about 3% to about 10% by adjusting a thickness of the transmittance control layer 110. For example, the transmittance control layer 110 may have a transmittance of about 6% when the transparent layer 100 has a transmittance of about 100%.

The transmittance control layer 110 may be formed using chrome (Cr) and/or a chrome compound. For example, the transmittance control layer 110 may include chrome, chrome oxynitride (CrOxNy), chrome oxide (CrOx), etc. These may be used alone or in a combination thereof.

To remove sulfuric acid ions ($SO_4^{2-}$) that cause haze defects of a phase shift mask, an additional cleaning process may be performed about the phase shift mask using an alkaline cleaning solution such as an SC 1 solution. The SC 1 solution may usually include ammonium hydroxide, hydrogen peroxide, and water to remove minute contaminants besides the sulfuric acid ions. In the additional cleaning process using the SC 1 solution, ammonia ions ($NH_4^+$) may react with the sulfuric ions to generate a salt of ammonium sulfate [$(NH_4)_2SO_4$]. The salt of ammonium sulfate may be removed by a rinsing process using deionized water, so that a material causing the haze defects of the phase shift mask may be effectively removed. However, a phase shift layer of the phase shift mask may be damaged by hydrogen group (—OH) in the SC 1 solution while cleaning the phase shift mask using the SC 1 solution. Thus, undesired defects may occur in the phase shift mask having the damaged phase shift layer. When a minute pattern having high resolution is formed using such phase shift mask, some problems such as a phase shift of a light and a transmittance variation of a light may be generated, thereby deteriorating the minute pattern. To reduce the damage to the phase shift layer, a cleaning solution including diluted ammonium hydroxide having a concentration of about 500 ppm may be used in an additional cleaning process. However, the cleaning solution including diluted ammonium hydroxide may not effectively remove the sulfuric acid ions because the concentration of ammonium ions in the cleaning solution is relatively low. Particularly, the conventional phase shift mask having a phase shift layer including molybdenum compound, and the phase shift layer of molybdenum compound may have poor tolerance relative to an alkaline cleaning solution. Hence, the phase shift layer may be easily damaged by the alkaline cleaning solution, thereby causing some problems of the phase shift mask, for example, reduction of phaser, increase of transmittance, etc.

The phase shift mask according to example embodiments has the transmittance control layer 110 including chrome and/or a chrome compound, to reduce or prevent damage to a phase shift pattern 118 (see FIG. 8) of the phase shift mask when the phase shift mask is cleaned using an alkaline cleaning solution.

Referring now to FIG. 3, a shading layer 120 is formed on the transmittance layer 110. The shading layer 120 remains in the second region of the transparent layer 110 through successive processes. The shading layer 120 may block a light irradiated onto the second region of the transparent layer 100, and thus the shading layer 120 may be formed using a material that effectively blocks the light. Further, the shading layer 120 may include a material that reduces a stress generated between the shading layer 120 and a hard mask layer 130 formed on the shading layer 120. In example embodiments, the shading layer 120 may be formed using molybdenum compound. For example, the shading layer 120 may include molybdenum silicon (MoSix), molybdenum silicon oxide (MoSixOy), molybdenum silicon oxynitride (MoSixOyNz), etc. These may be used alone or in a combination thereof.

The hard mask layer 130 is formed on the shading layer 120. The hard mask layer 130 may be formed using a material that has relatively high etching selectivity relative to the shading layer 120. The hard mask layer 130 may include chrome and/or a chrome compound. For example, the hard mask layer 130 may be formed using chrome, chrome oxide, chrome oxynitride, etc. These may be used alone or in a combination thereof. When the hard mask layer 130 includes chrome and/or a chrome compound, the hard mask layer 130 may have a very small thickness because the hard mask layer 130 has a high etching selectivity with respect to the shading layer 120. In example embodiments, the hard mask layer 130 may include a material substantially the same as or substantially similar to that of the transmittance layer 110. However, the transmittance layer 110 and the hard mask layer 130 may include different materials, respectively.

According to some example embodiments, the hard mask layer 130 having a relatively large thickness may be formed on the shading layer 120 using nitride or oxynitride. For example, the hard mask layer 130 may include silicon oxide, silicon oxynitride, etc.

A first photoresist pattern 140 and a second photoresist pattern 141 are formed on the hard mask layer 130. The first photoresist pattern 140 may selectively expose a portion of the hard mask layer 130 positioned in the first region. The second photoresist pattern 141 may cover a portion of the hard mask layer 130 located in the second region. The second photoresist pattern 141 may have a width substantially larger than that of the first photoresist pattern 140.

In formation of the first and the second photoresist patterns 140 and 141 according to example embodiments, a first photoresist film may be coated on the hard mask layer 130. Then, the first photoresist film may be patterned through an exposure process and a developing process, so that the first and the second photoresist patterns 140 and 141 may be formed on the hard mask layer 130.

In some example embodiments, a first photoresist film may be formed on the hard mask layer 130, and then the first photoresist film may be patterned using electron beam (e-beam), thereby obtaining the first and the second photoresist patterns 140 and 141 having minute dimensions on the hard mask layer 130.

Figure 4:
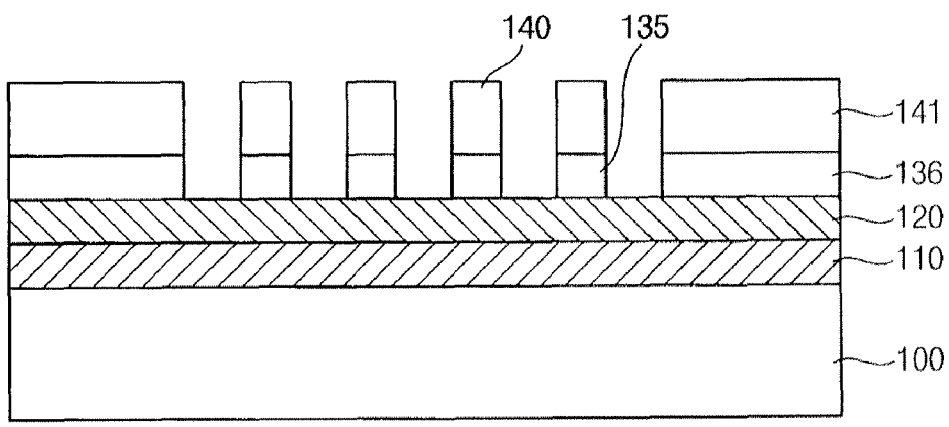

Referring to FIG. 4, the hard mask layer 130 is etched using the first and the second photoresist patterns 140 and 141 as etching masks, such that a first hard mask pattern 135 and a second hard mask pattern 136 are formed on the shading layer 120. The first hard mask pattern 135 is formed beneath the first photoresist pattern 140, and the second hard mask pattern 136 is located beneath the second photoresist pattern 141. The first and the second hard mask patterns 135 and 136 may have structures substantially the same as or substantially similar to those of the first and the second photoresist patterns 140 and 141. Therefore, the first hard mask pattern 135 may selectively expose a portion of the shading layer 120 in the first region whereas the second hard mask pattern 136 may cover a portion of the shading layer 120 in the second region.

Figure 5:
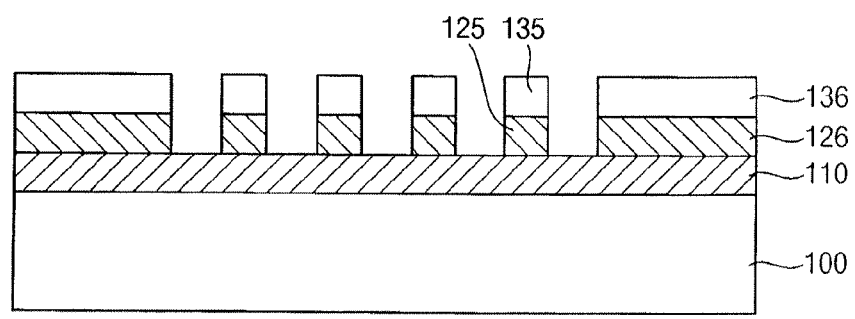

Referring to FIG. 5, the first and the second photoresist patterns 140 and 141 are removed from the first and the second hard mask patterns 135 and 136. In example embodiments, the first and the second photoresist patterns 140 and 141 may be removed by an ashing process using oxygen plasma. In some example embodiments, the first and the photoresist patterns 140 and 141 may be completely removed from the first and the second hard mask patterns 135 and 136 through an additional stripping process.

Using the first and the second hard mask patterns 135 and 136 as etching masks, the shading layer 120 is etched to form a first shading layer pattern 125 and a preliminary second shading layer pattern 126 on the transmittance control layer 110. The first shading layer pattern 125 is located beneath the first hard mask pattern 135, and the preliminary second shading layer pattern 126 is positioned beneath the second hard mask pattern 136. Thus, the first shading layer pattern 125 may selectively cover a portion of the transmittance control layer 110 in the first region whereas the preliminary shading layer pattern 126 may cover a portion of the transmittance layer pattern 110 in the second region.

Figure 6:
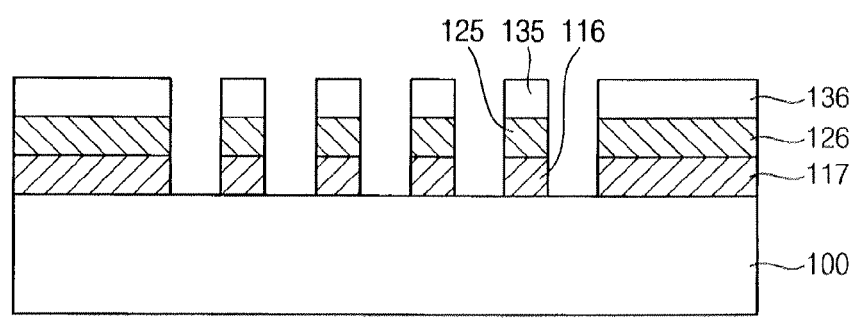

Referring to FIG. 6, the transmittance layer 110 is etched using the first and the second hard mask patterns 135 and 136 and the first and the preliminary second shading layer patterns 125 and 126 as etching masks. Hence, a second pattern 116 of the phase shift layer pattern 118 (see FIG. 8) and a transmittance control layer pattern 117 are formed on the transparent layer 100. The second pattern 116 may be an upper pattern of the phase shift pattern 118. The second pattern 116 is formed beneath the first shading layer pattern 125, and the transmittance control layer pattern 117 is positioned beneath the preliminary second shading layer pattern 126. That is, the second pattern 116 and the transmittance control layer pattern 117 are located in the first region and the second region of the transparent layer 100, respectively. The second pattern 116 of the phase first pattern 118 may selectively expose a portion of the transparent layer 100. A portion of the transparent layer 100 may be covered with the transmittance control layer pattern 117.

Figure 7:
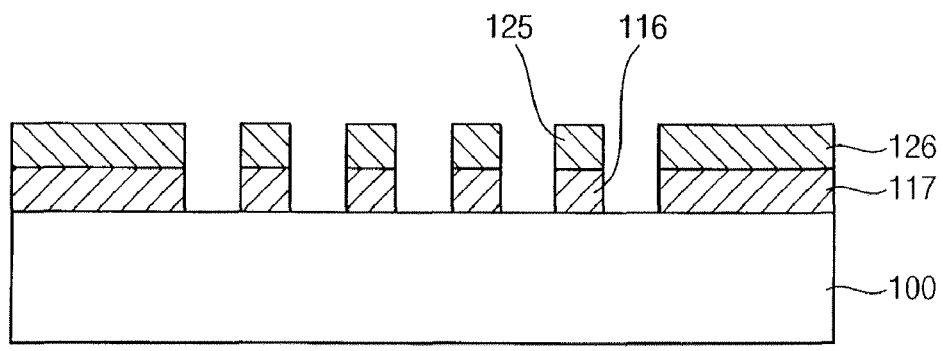

As illustrated in FIG. 7, the first and the second hard mask patterns 135 and 136 may be etched in an etching process for forming the second pattern 116 and the transmittance control layer pattern 117 when the hard mask layer 130 includes a material substantially the same as or substantially similar to that of the transmittance layer 110. Namely, an additional etching process for removing the first and the second hard mask patterns 135 and 136 may not be required when the hard mask layer 130 includes a material substantially the same as or substantially similar to that of the transmittance layer 110.

In example embodiments, the transmittance control layer 110 may include the material substantially the same as or substantially similar to that of the hard mask layer 130, so that the first and the second hard mask patterns 135 and 136 may be removed while forming the second pattern 116 and the transmittance control layer pattern 117. Therefore, manufacturing processes for forming the phase shift mask may be more simplified.

Figure 8:
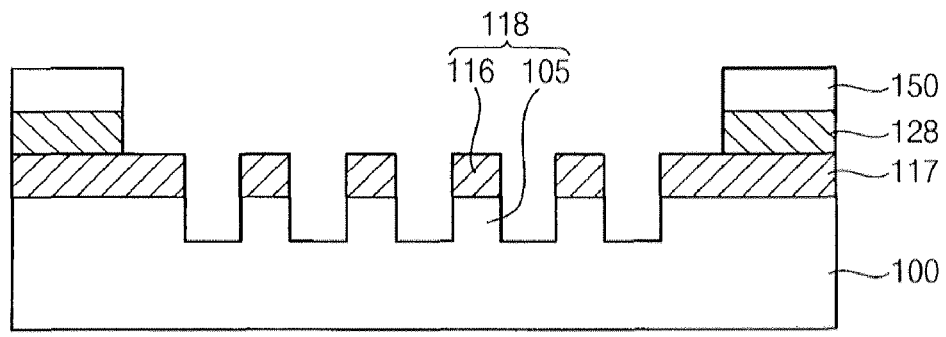

Referring to FIG. 8, a third photoresist pattern 150 is formed on the preliminary second shading layer pattern 126. The third photoresist pattern 150 may have an area substantially smaller than that of the preliminary second shading layer pattern 126. Thus, the preliminary second shading layer pattern 126 adjacent to the first shading layer pattern 125 may be partially exposed by the third photoresist pattern 150. In example embodiments, a second photoresist film (not illustrated) may be formed on the preliminary second shading layer pattern 126 and the first shading layer pattern 125, and then the second photoresist film may be patterned to form the third photoresist pattern 150 on the preliminary second shading layer pattern 126.

The portion of the transparent layer 100 in the first region is etched using the second pattern 116 and the first shading layer pattern 125, such that a first pattern 105 is formed beneath the second pattern 116. Here, the first pattern 105 may be a lower pattern of the phase shift pattern 118 whereas the second pattern 116 may be the upper pattern. Thus, the phase shift pattern 118 including the first and the second patterns 105 and 116 is formed in the first region of the transparent layer 100. Here, the first pattern 105 may have a thickness and a construction substantially the same as or substantially similar to those of the second pattern 116 by adjusting process conditions of an etching process forming the first pattern 105. The first pattern 105 may be integrally formed with the transparent layer 100 because the first pattern 105 is obtained by partially etching the transparent layer 100.

The first shading layer pattern 125 and the exposed portion of the preliminary second shading layer pattern 126 are etched using the third photoresist pattern 150 and an etching mask. Hence, a second shading layer pattern 128 is formed on the transmittance layer pattern 117 while removing the first shading layer pattern 125. The second shading layer pattern 128 may have a dimension substantially smaller than that of the transmittance control layer pattern 117, so that the transmittance control layer pattern 117 and the second shading layer pattern 128 may provide a stepped structure on the transparent layer 100 in the second region.

In example embodiments, the transparent layer 100 in the first region may be partially etched while forming the second shading layer pattern 128 when the transparent layer 100 has an etching selectivity substantially the same as or substantially similar to that of the shading layer 120. Therefore, the phase shift pattern 118 may be obtained through more simplified processes. The phase shift pattern 118 may include the first and the second patterns 105 and 116 which include different materials.

As for the phase shift pattern 118 having the first and the second patterns 105 and 116, light may pass through different passages formed by the first and the second patterns 105 and 116 and grooves or recesses 118a located adjacent to the first and the second patterns 105 and 116, so that the light passing through one passage formed by one recess 118a may have a phase difference of about 180° from light passing through an adjacent recess 118a. Destructive interference of the light having the phase difference of about 180° may be generated between adjacent recesses 118a, and thus the intensity of the lights at the adjacent recess may be reduced to substantially zero.

In some example embodiments, the first shading layer pattern 125 may be removed from the second pattern 116, and then the first pattern 105 may be formed by partially etching the transparent layer 100 using the second pattern 116 as an etching mask. The second shading layer pattern 128 may be formed from the preliminary second shading layer pattern 126 while removing the first shading layer pattern 125.

According to example embodiments, the phase shift pattern 118 includes the second pattern 116 including chrome and the first pattern 105 including the transparent material. When the phase shift mask having the phase shift pattern 118 is cleaned in a first cleaning process using a first cleaning solution including sulfuric acid and a second cleaning process using a second cleaning process including ammonium hydroxide, a concentration of ammonium hydroxide in the second cleaning solution may be increased to completely remove sulfuric acid ions from the phase shift mask because the phase shift pattern 118 may have high endurance relative to a strong alkaline cleaning solution. Therefore, the sulfuric acid ions causing haze defects may be fully removed from the phase shift mask without damaged to the phase shift pattern 118.

Figure 9:
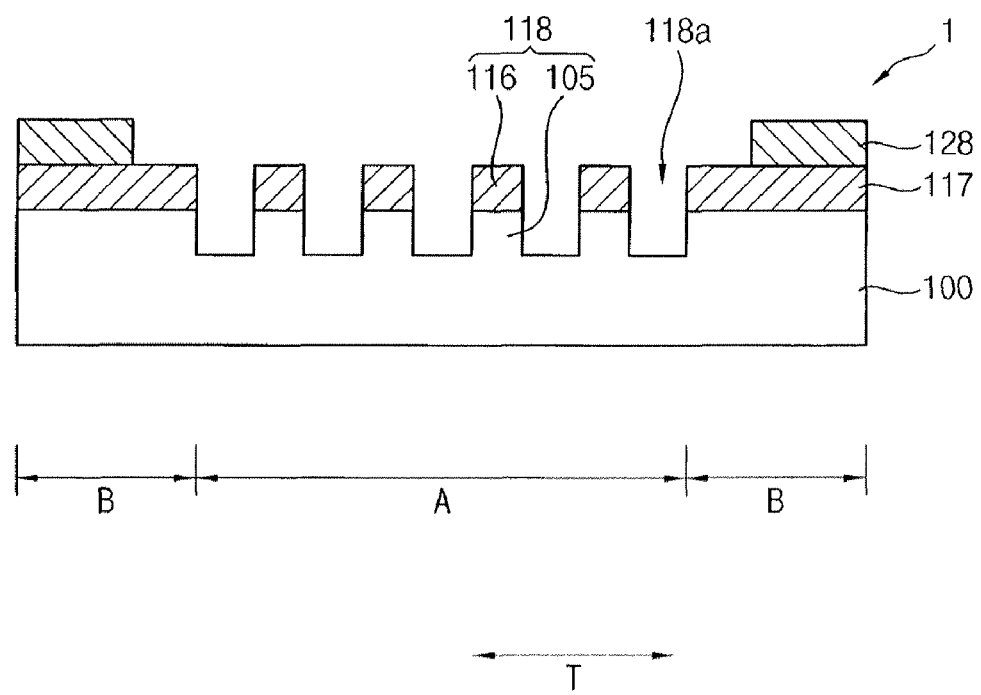

Referring to FIG. 9, the third photoresist pattern 150 is removed from the second shading layer pattern 128. The third photoresist pattern 150 may be removed by an ashing process using oxygen plasma and/or a stripping process. As a result, there is provided a phase shift mask having the transparent layer 110, the first pattern 105, the second pattern 116, the transmittance control layer pattern 117 and the second shading layer pattern 128 in the second region B that surrounds the first region A in a transverse direction T of the phase shift mask 1. In the phase shift mask according to example embodiments, the phase shift pattern 118 may be disposed in a first region of the phase shift mask, and the second shading layer pattern 128 may be positioned in a second region of the phase shift mask around the first region including the phase shift pattern 118.

As illustrated in FIG. 9, the second shading layer pattern 128 and the transmittance control layer pattern 117 may be formed only in the second region B of the phase shift mask 1, or a region external to the phase shift pattern 118. However, as illustrated in FIGS. 3-8, the transmittance control layer pattern 117 and the second pattern 116 of the phase shift pattern 118 may be formed of the same transmittance control layer 110.

According to example embodiments, a phase shift mask includes a phase shift pattern having a transparent first pattern and a second pattern including chrome and/or chrome compound, so that the phase shift pattern may not be damaged in a cleaning process using a strong alkaline cleaning solution for removing sulfuric acid ions, and haze defects of the phase shift mask may be effectively prevented. When a minute pattern in a semiconductor device is formed using the phase shift mask, a failure of the semiconductor device may be prevented because the minute pattern may have high resolution and precise construction. Additionally, a shading layer pattern and a transmittance layer pattern are provided adjacent to the phase shift pattern, such that the phase shift mask may have enhanced endurance relative to internal and/or external stress, and the minute pattern may have required dimensions by preventing a light from passing through a region adjacent to the phase shift pattern in an exposure process.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A phase shift mask having a first region and a second region in a transverse direction of the phase shift mask, comprising:
    a phase shift pattern disposed in the first region, the phase shift pattern having a first pattern including a transparent material and a second pattern including metal;
    a transmittance control layer pattern disposed in the second region, the second region being a peripheral portion surrounding the first region; and
    a shading layer pattern disposed on the transmittance control layer pattern in the second region surrounding the first region, the shading layer pattern having a dimension smaller than a dimension of the transmittance control layer pattern.

2. The phase shift mask of claim 1, comprising:
    a transparent layer,
    wherein the transparent material of the phase shift pattern is part of the transparent layer.

3. The phase shift mask of claim 1, wherein the first pattern includes quartz, glass, or transparent resin.

4. The phase shift mask of claim 1, wherein the second pattern includes at least one selected from the group consisting of chrome, chrome oxide, and chrome oxynitride.

5. The phase shift mask of claim 1, wherein the second pattern includes a material substantially the same as a material of the transmittance control layer pattern.

6. The phase shift mask of claim 1, wherein the first pattern has a thickness substantially the same as a thickness of the second pattern.

7. The phase shift mask of claim 1, wherein the shading layer pattern includes at least one selected from the group consisting of molybdenum silicon, molybdenum silicon oxide and molybdenum silicon oxynitride.

8. The phase shift mask of claim 1, wherein the shading layer pattern has an etching selectivity substantially the same as an etching selectivity of the transparent layer.

9. A phase shift mask, having a first region and a second region, comprising:
    a transparent layer disposed in the first and second regions, the second region being a peripheral portion surrounding the first region;
    a first pattern including a transparent material disposed on the transparent layer;
    a transmittance control layer pattern disposed surrounding the first pattern on the transparent layer, the transmittance control layer pattern including chrome;
    a second pattern including metal disposed on the first pattern;
    a shading layer pattern disposed on the transmittance control layer pattern and having a dimension smaller than a dimension of the transmittance control layer pattern; and
    a hard mask layer disposed on the shading layer pattern and the second pattern, the hard mask layer including chrome.

10. The phase shift mask of claim 9, wherein the transmittance control layer pattern has a transmittance in a range of about 3% to about 10% of a transmittance of the transparent layer.

11. The phase shift mask of claim 9, wherein the transmittance control layer pattern includes a material substantially the same as a material of the hard mask layer.

12. The phase shift mask of claim 9, wherein the hard mask layer includes at least one selected from the group consisting of chrome, chrome oxide, and chrome oxynitride.

13. A phase shift mask having a first region and a second region, the phase shift mask comprising:
    a phase shift pattern in the first region and including a first transparent pattern and a second pattern including metal located on the first pattern;
    a transmittance control layer pattern in the second region, the second region being a peripheral portion surrounding the first region; and
    a shading layer pattern located on the transmittance control layer pattern in the second region, the shading layer pattern having a dimension smaller than a dimension of the transmittance control layer pattern.

14. The phase shift mask according to claim 13, further comprising:
    a transparent layer,
    wherein the first transparent pattern is formed in the transparent layer, and
    the transmittance control layer pattern is located on the transparent layer.

15. The phase shift mask according to claim 14, wherein the second pattern covers the first pattern, and
    the transmittance control layer pattern covers an entire part of the transparent layer located in the second region.

16. The phase shift mask according to claim 14, wherein the transmittance control layer pattern has a transmittance in a range of about 3% to about 10% of a transmittance of the transparent layer.

17. The phase shift mask according to claim 13, wherein the transmittance control layer pattern and the second pattern are made of the same material.

18. The phase shift mask according to claim 13, wherein an end of the shading layer pattern closest to the phase shift pattern is offset from an end of the transmittance control layer pattern adjacent to the phase shift pattern in a direction away from the phase shift pattern.

19. The phase shift mask according to claim 13, wherein the second pattern includes chrome.

* * * * *